US 8,582,274 B2

(12) United States Patent
Kamimura et al.

(10) Patent No.: US 8,582,274 B2
(45) Date of Patent: Nov. 12, 2013

(54) TRAY FOR TRANSPORTING WAFERS AND METHOD FOR FIXING WAFERS ONTO THE TRAY

(75) Inventors: Ryuichiro Kamimura, Shizuoka (JP); Kazuhiro Watanabe, Shizuoka (JP); Ryuji Hashimoto, Shizuoka (JP)

(73) Assignee: Ulvac, Inc., Kanagawa (JP)

( * ) Notice: Subject to any disclaimer, the term of this patent is extended or adjusted under 35 U.S.C. 154(b) by 0 days.

(21) Appl. No.: 12/991,674

(22) PCT Filed: Feb. 9, 2010

(86) PCT No.: PCT/JP2010/051894
§ 371 (c)(1),
(2), (4) Date: Nov. 8, 2010

(87) PCT Pub. No.: WO2010/095540
PCT Pub. Date: Aug. 26, 2010

(65) Prior Publication Data
US 2011/0292561 A1    Dec. 1, 2011

(30) Foreign Application Priority Data

Feb. 18, 2009  (JP) .................. 2009-035713

(51) Int. Cl.
*H01T 23/00*     (2006.01)

(52) U.S. Cl.
USPC ........................................ 361/234

(58) Field of Classification Search
USPC ................................. 361/234, 230
See application file for complete search history.

(56) References Cited

U.S. PATENT DOCUMENTS

| 4,897,171 A | * | 1/1990 | Ohmi ...................... 204/298.15 |
| 5,250,137 A | * | 10/1993 | Arami et al. ............. 156/345.44 |
| 5,625,526 A | * | 4/1997 | Watanabe et al. ............. 361/234 |
| 7,952,851 B2 | * | 5/2011 | LaFontaine et al. .......... 361/234 |
| 8,199,454 B2 | * | 6/2012 | Koyama et al. ............... 361/234 |
| 8,218,284 B2 | * | 7/2012 | Chen et al. .................... 361/234 |

FOREIGN PATENT DOCUMENTS

| JP | 05-245967 A | 9/1993 |
| JP | 2002-043404 A | 2/2002 |
| JP | 2003-249541 A | 9/2003 |
| JP | 2006-059853 A | 3/2006 |
| JP | 2007-201404 A | 8/2007 |
| JP | 2008-198739 A | 8/2008 |

* cited by examiner

*Primary Examiner* — Danny Nguyen
(74) *Attorney, Agent, or Firm* — Arent Fox LLP (57) ABSTRACT

A tray for transporting a wafer is herein provided, which can control the temperature of the wafer upon the processing thereof, and which can easily fix the wafer without reducing the effective area on the surface of the wafer and without requiring much time for the adhesion of the wafer thereto and without requiring any post-treatment after the wafer is detached from or attached to the tray. The tray 302 is one which comprises a base body consisting of an insulating material and an electrostatic chuck electrode 306 embedded in the base body, wherein the terminal at a load-dispatching or power supply portion for energizing the electrostatic chuck electrode is a spring-type terminal 305a, the spring-type terminal is so designed that the tip of the same can come in touch with the electrostatic chuck electrode, and further the tray is so designed that a sealing member 305b is provided at the periphery of the load-dispatching portion so that any heat-exchanging medium never passes around the contact portion or area between the tip of the spring-type terminal and the electrostatic chuck electrode and that the tray can thus fixe the wafer S thereto through the electrostatic chucking. Thus, the wafer is fixed to this wafer-transporting tray by the action of the electrostatic chucking.

10 Claims, 4 Drawing Sheets

TRAY FOR TRANSPORTING WAFERS AND METHOD FOR FIXING WAFERS ONTO THE TRAY

CROSS-REFERENCE TO RELATED APPLICATION

This application is a National Stage entry of International Application No. PCT/JP2010/051894, filed Feb. 9, 2010, which claims priority to Japanese Application No. 2009-035713, filed Feb. 18, 2009 the disclosure of the prior application is hereby incorporated in its entirety by reference.

TECHNICAL FIELD

The present invention relates to a tray for transporting a wafer and a method for fixing the wafer onto the tray and, in particular, to a tray for transporting a wafer in which an electrostatic chuck electrode is embedded and a method for electrostatically fixing a wafer onto the tray.

BACKGROUND ART

Conventionally, when collectively treating a large number of, for instance, wafers according to the plasma technique to produce semiconductor devices, it has been common to use a tray for transporting wafers. At that time, wafers or the like are simply placed on the tray or fixed thereto through the use of a holding or pressing jig or by the adhesion thereof to the tray with the use of, for instance, a sheet, a tape or grease, prior to subjecting them to a plasma treatment.

In this respect, it has been known that, when producing, for instance, a semiconductor device or a liquid crystal device and collectively treating a large number of waters or the like, the wafers or the like are fixed to a tray for transporting the same using a pressing means, and a tray composed of a protective substrate and a semiconductor substrate, serving as a tray for transportation, is conveyed, while it is set on an electrostatic chuck (see Patent Document 1 specified below).

It has also been known that semiconductor wafers or the like are processed, while they are held on a processing base by the adhesion of the same to the processing base through a foamed releasable sheet (see, for instance, Patent Document 2 specified below) or that a material to be processed such as a substrate is adhered to a processing base using a thermally releasable adhesive member such as a foamed releasable sheet (see, for instance, Patent Document 3 specified below).

Figure 1:
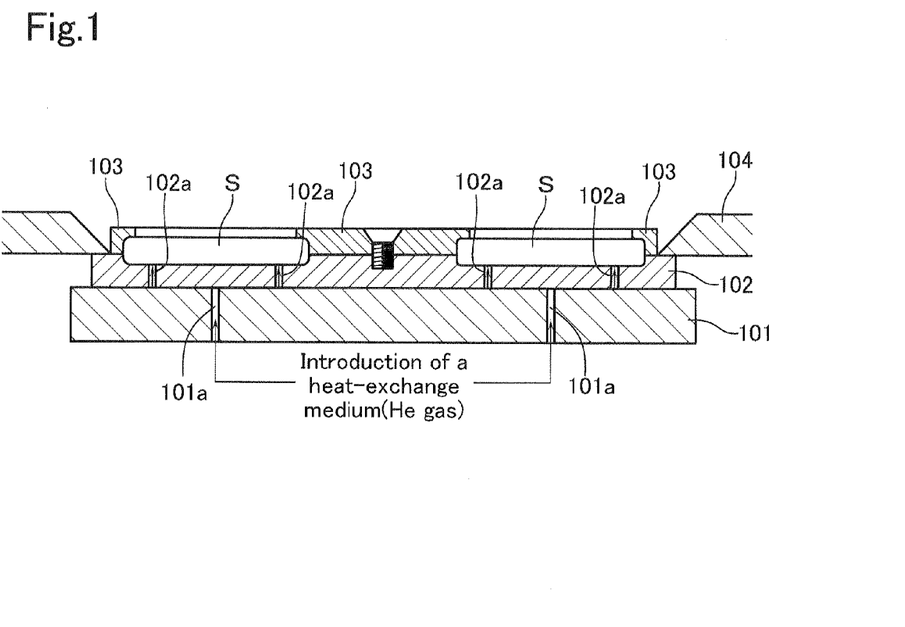
FIG. 1 is a schematic cross sectional view showing an example of the system for fixing a wafer to a tray using a holding or pressing jig according to a conventional technique.

The means for fixing a wafer onto a tray will hereunder be described, while referring to FIG. 1 which shows an example of the system for fixing a wafer to a tray through the use of a pressing jig as the pressing means described above and for simultaneously fixing the tray onto a processing stage using a mechanical clamping means.

Referring to FIG. 1, a tray-supporting stage 101 is provided with a plurality of or a number of flow paths 101a for allowing a heat-exchanging medium (such as helium (He) gas) to flow through the same. More specifically, the system for fixing a wafer to a tray as shown in FIG. 1 is so designed that a heat-exchanging medium introduced into the flow paths 101a first passes through the interior of the tray-supporting stage 101 and it is then supplied to the back face of a tray 102, which is placed on the tray-supporting stage 101, and simultaneously supplied to the back face of a wafer S to thus cool the tray 102 and the wafer S at the same time. The system for fixing a wafer to a tray as shown in FIG. 1 is likewise so designed that the marginal peripheral portion of the wafer S placed on the tray 102 is fixed onto the tray 102 by a holding or pressing jig 103 and the tray 102 is fixed onto the tray-supporting stage 101 by the action of a mechanical clamping member 104. In the case of this system, problems arise such that the fixation of the wafer S to the tray 102 requires much time, that the stability of the fixation of this type is insufficient in its reliability and that the effective areal region on the surface of the wafer S, which can be processed, is considerably reduced since the portion of the wafer S at the marginal periphery thereof, which comes in close contact with the pressing jig, cannot be subjected to the desired processing and, in other words, there are generated dead areas free of any processing at the portions used for holding or clamping the wafer.

Figure 2:
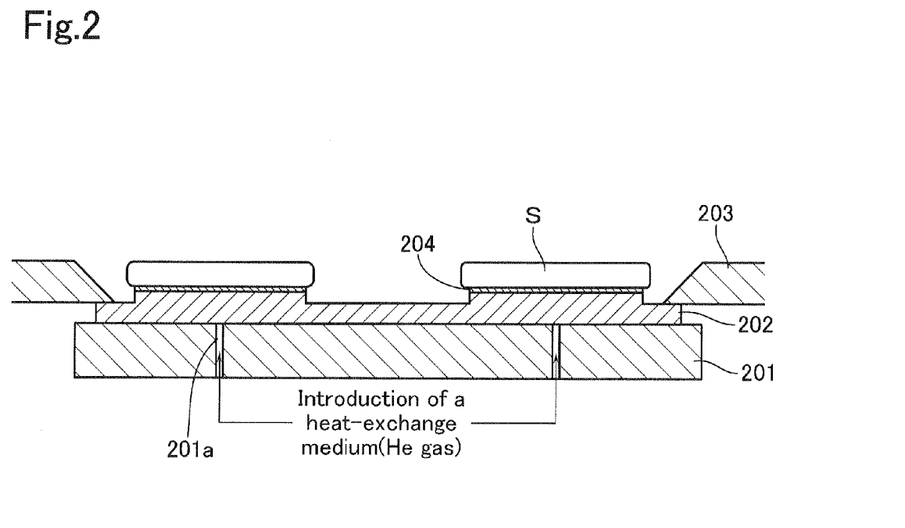
FIG. 2 is a schematic cross sectional view showing an example of the system for fixing a wafer to a tray using an adhesive sheet or tape according to a conventional technique.

Alternatively, another means for fixing a wafer onto a tray will hereunder be described, while referring to FIG. 2 which shows an example of the system for fixing a wafer to a tray by adhering the wafer to the tray through the use of an adhesive sheet such as the foregoing foamed releasable sheet and for simultaneously fixing the tray to a processing stage through the use of a mechanical clamp or an electrostatic chuck.

Referring now to FIG. 2, a tray-supporting stage 201 is provided with a plurality of or a number of flow paths 201a for allowing a heat-exchanging medium (such as helium (He) gas) to flow through the same. More specifically, the system for fixing a wafer to a tray as shown in FIG. 2 is so designed that a heat-exchanging medium introduced into the flow paths 201a can be supplied to the back face of the tray 202 mounted on the tray-supporting stage 201 to thus cool the tray 202. The system for fixing a wafer to a tray as shown in FIG. 2 is likewise so designed that the wafer S to be placed on the tray 202 is fixed onto the tray 202 through a heat-conductive adhesive sheet 204, while the tray 202 is fixed onto the tray-supporting stage 201 by a mechanical clamping member 203 or an electrostatic chuck means (not shown) which is embedded in the tray-supporting stage 201. In the case of this system, problems likewise arise such that the fixation of the wafer S to the tray requires much time, that the stability of the fixation of this type is insufficient in its reliability and that the system is inferior in the cooling efficiency.

PRIOR ART LITERATURE

Patent Documents

Patent Document 1: Japanese Un-Examined Patent Publication 2006-59853;
Patent Document 2: Japanese Un-Examined Patent Publication Hei 5-245967;
Patent Document 3: Japanese Un-Examined Patent Publication 2007-201404.

SUMMARY OF THE INVENTION

Problems That the Invention is to Solve

As has been described above, it has conventionally been common that a wafer or the like is simply placed on a tray. When the system requires the control of the temperature thereof, however, a problem arises such that the temperature thereof is controlled with considerable difficulty.

Furthermore, when a pressing means is used for fixing a wafer as in the case of the method disclosed in the foregoing Patent Document 1, a problem arises such that the effective area on the surface of a wafer capable of being processed is reduced by the area corresponding to that on the wafer pressed by or covered with the pressing means, while when a wafer or the like is fixed to a tray through adhesion as in the case of the methods disclosed in Patent Documents 2 and 3, problems likewise arise such that the adhesion of the wafer to the tray requires much time and that post-treatments are required after the wafer is detached from the tray.

Accordingly, it is a general object of the present invention to solve the foregoing problems associated with the conventional techniques and more specifically to provide a tray for transporting a wafer, which permits the temperature control of the wafer or the like when processing the same, and which can easily fix the wafer without reducing the effective area, on the wafer surface, capable of being processed and without requiring much time for the adhesion of the wafer thereto and without requiring any post-treatment after the wafer is detached from the tray as well as a method for fixing a wafer to the tray while using an electrostatic chuck.

Means for the Solution of the Problems

The tray for transporting a wafer according to the present invention is one which comprises a base body consisting of an insulating material and an electrostatic chuck electrode embedded in the base body, wherein the terminal at a load-dispatching or power supply portion for energizing the electrostatic chuck electrode is a spring-type terminal, the tip of the spring-type terminal is so designed that it can come in touch with the electrostatic chuck electrode to thus allow the tray to fix the wafer by the electrostatic chucking system upon passing an electric current through the same or when applying current to the same, and the tray is further designed in such a manner that a sealing member is provided at the periphery of the load-dispatching portion or the power feeding portion so that any heat-exchanging medium never passes around the contact portion or area between the tip of the spring-type terminal and the electrostatic chuck electrode.

According to the present invention, a tray for transporting a wafer can be provided, which permits the temperature control of the wafer when processing the same, and which can easily fix the wafer without reducing the effective area, on the wafer surface, capable of being processed and without requiring much time for the adhesion of the wafer thereto and without requiring any post-treatment after the wafer is detached from the tray, since the tray for transporting a wafer is equipped with an electrostatic chuck.

Furthermore, the tray for transporting a wafer according to the present invention is one which is composed of an electrically conductive material and an insulating material covering the surface of the former, wherein the terminal at the load-dispatching portion for energizing the electrically conductive material serving as an electrostatic chuck electrode is a spring-type terminal, the spring-type terminal is so designed that the tip of the terminal can come in touch with the electrically conductive material to thus allow the tray to fix the wafer by the electrostatic chucking system upon the passage of an electric current through the same, and the tray is further designed in such a manner that a sealing member is provided at the periphery of the load-dispatching portion so that any heat-exchanging medium never passes around the contact portion or area between the tip of the spring-type terminal and the electrostatic chuck electrode.

As has been described above, the foregoing base body may be one consists of an electrically conductive material whose surface is covered with an insulating material. In this case, the tray has such an advantage that the production cost of the same can be reduced.

The tray according to the present invention is further characterized in that it is provided with a plurality of flow paths for allowing the heat-exchange medium to pass through the same, which are formed through the tray and communicate the back with the surface thereof, wherein each of the flow paths is one for supplying, to the back face of the wafer, the heat-exchange medium which is introduced into the space formed between the back face of the tray and the surface of the stage when the tray is placed on the wafer-supporting stage.

The tray according to the present invention is characterized in that the foregoing electrostatic chuck is a mono-polar electrostatic chuck or a bipolar electrostatic chuck.

The tray according to the present invention is characterized in that the wafer is an insulating substrate and the electrostatic chuck is a mono-polar electrostatic chuck. In this connection, it is difficult to chuck an insulating substrate in the case of the usual electrostatic chucking system, but such an insulating substrate can be chucked when using a tray equipped with a mono-polar electrostatic chuck system.

The method for fixing a wafer according to the present invention is characterized in that it comprises the steps of placing a wafer on a tray for transporting the same, which comprises a base body consisting of an insulating material and an electrostatic chuck electrode embedded in the base body, wherein the terminal at a load-dispatching or power supply portion for energizing the electrostatic chuck electrode is a spring-type terminal, the spring-type terminal is so designed that the tip of the same can come in touch with the electrostatic chuck electrode to thus allow the tray to fix the wafer by the electrostatic chucking system upon the passage of an electric current through the same, and the tray is further designed in such a manner that a sealing member is provided at the periphery of the load-dispatching portion so that any heat-exchanging medium never passes around the contact portion or area between the tip of the spring-type terminal and the electrostatic chuck electrode; conveying the tray provided thereon with a wafer to a plasma-processing chamber to thus mount the tray on a tray-supporting stage; fixing the tray onto the tray-supporting stage by the mechanical chucking or the electrostatic chucking; and then supplying an electric power to the spring-type terminal to thus fix the wafer to the tray by the electrostatic chucking.

In the foregoing method for fixing a wafer, a base body which consists of an electrically conductive material whose surface is covered with an insulating material may likewise be substituted for the foregoing base body composed of an insulating material. In this case, the electrically conductive material serves as an electrostatic chuck electrode and the terminal at a load-dispatching or power supply portion for energizing the electrically conductive material serving as an electrostatic chuck electrode is a spring-type one, as has been discussed above.

The foregoing method for fixing a wafer according to the present invention is also characterized in that a mono-polar electrostatic chuck or a bipolar electrostatic chuck is used as the electrostatic chuck which is embedded in the base body.

The foregoing method for fixing a wafer according to the present invention is further characterized in that an insulating substrate is used as the wafer, that a mono-polar electrostatic chuck is used as the electrostatic chuck which is embedded in the base body, and that the generation of plasma is started within the plasma-treating chamber upon the supply of an electric power to the spring-type terminal to thus fix the wafer by the electrostatic chucking.

In this connection, it is difficult to chuck an insulating substrate in the case of the usual electrostatic chucking system, but such an insulating substrate can be chucked when using a mono-polar electrostatic chuck.

Effects of the Invention

According to the present invention, the tray for transporting a wafer is equipped with a chucking system which makes use of an electrostatic force, the wafer simply placed on the tray can be transported and the wafer can thus be fixed to the tray by the electrostatic chucking within a plasma-processing chamber. Thus, the present invention permits the achievement of such effects that the effective area on the wafer surface capable of being processed is not substantially reduced, that the temperature of the wafer can easily be controlled and that the time and labor required before and after the fixation of the wafer can considerably be saved.

MODE FOR CARRYING OUT THE INVENTION

According to an embodiment of the present invention, the tray for transporting a wafer is one which comprises a base body consisting of an insulating material and an electrostatic chuck electrode composed of an electrically conductive material and embedded in the base body, wherein the terminal at a load-dispatching or power supply portion for energizing the electrostatic chuck electrode is a spring-type terminal, the spring-type terminal is so designed that the tip of the spring-type terminal can come in touch with the electrostatic chuck electrode through passages formed in a tray-supporting stage for placing the tray to thus allow the tray to fix the wafer by the electrostatic chucking upon the passage of an electric current through the same, a sealing member is provided at the periphery of the load-dispatching portion so that any heat-exchange medium never passes around the contact portion or area between the tip of the spring-type terminal and the electrostatic chuck electrode, and the electrostatic chuck for fixing the wafer to the tray is a mono-polar electrostatic chuck or a bipolar electrostatic chuck; and according to a further embodiment of the present invention, the tray for transporting a wafer is further characterized in that it is provided with a plurality of flow paths for allowing the heat-exchange medium to pass through the same, which are formed through the tray and communicate the back face with the surface thereof, wherein each of the flow path is one for supplying, to the back face of the wafer, the heat-exchange medium which is introduced into the space formed between the back face of the tray and the surface of the stage when the tray is placed on the wafer-supporting stage. In this case, the base body consisting of an insulating material can be replaced with one consisting of an electrically conductive material whose surface is covered with a film consisting of an insulating material.

In the present invention, the base body consisting of an insulating material is produced from, for instance, alumina and quartz, the electrostatic chuck electrode is produced from, for instance, a metal material such as Al, Cu, Ti and W, the sealing member may be an O-ring and it is produced from, for instance, Teflon (registered trade mark), the base body consisting of an electrically conductive material is produced from the usual electrically conductive material and the insulating film formed on the surface of the electrically conductive base body is formed from, for instance, $Al_2O_3$ according to the currently used molten deposition technique or thermal spraying technique.

Thus, according to the present invention, there can be provided a tray for transporting a wafer, which permits the temperature control of the wafer when processing the same, and which can easily fix the wafer without reducing the effective area, on the wafer surface, capable of being processed and without requiring much time for the adhesion of the wafer thereto and without requiring any post-treatment after the wafer is detached from the tray, since the tray for transporting a wafer is equipped with an electrostatic chuck in a state embedded in the tray.

Thus, if using the tray for transporting a wafer according to the present invention, the effective area on the wafer surface which is intended to be processed is not substantially reduced, the temperature of the wafer can easily be controlled and the time and labor required before and after the fixation of the wafer can considerably be saved.

In the case of a wafer other than insulating substrates (such as those made of sapphire glass, quartz glass or the like), the wafer can be adsorbed on the tray irrespective of whether the electrostatic chuck is a mono-polar electrostatic chuck or a bipolar electrostatic chuck. In the case where an insulating substrate is used and the electrostatic chuck is mono-polar one, however, the wafer cannot electrostatically be fixed onto the tray unless the generation of plasma is started within the plasma-treating chamber upon the supply of an electric current to the spring-type terminal.

In addition, according to an embodiment of the method for fixing a wafer relating to the present invention, there can be provided a method characterized in that it comprises the steps of placing a wafer on a tray for transporting the same, which comprises a base body consisting of an insulating material and an electrostatic chuck electrode composed of an electrically conductive material and embedded in the base body, wherein the terminal at a load-dispatching or power supply portion for energizing the electrostatic chuck electrode is a spring-type terminal, the spring-type terminal is placed within a passage provided in a stage for placing or supporting the tray, the spring-type terminal is so designed that the tip of the same can come in touch with the electrostatic chuck electrode to thus allow the tray to fix the wafer by the electrostatic chucking upon the passage of an electric current through the same, a sealing member is provided at the periphery of the load-dispatching portion so that any heat-exchanging medium never passes around the contact portion or area between the tip of the spring-type terminal and the electrostatic chuck electrode, and further the tray is provided with a plurality of flow paths for allowing the heat-exchange medium to pass through the same, which are formed through the tray and communicate the back face to the surface thereof, in which each of the flow path is one for supplying, to the back face of the wafer, the heat-exchange medium introduced into the space formed between the back face of the tray and the surface of the stage when the tray is placed on the wafer-supporting stage; conveying the tray provided thereon with a wafer to a plasma-processing chamber to thus mount the tray on a tray-supporting stage; fixing the tray onto the tray-supporting stage by a mechanical chuck or the electrostatic chuck; and then supplying an electric power to the spring-type terminal through the supporting stage to thus fix the wafer to the tray by a mono-polar electrostatic chuck or a bipolar electrostatic chuck. In this case, the base body consisting of the insulating material can be replaced with one consisting of an electrically conductive material whose surface is covered with an insulating material.

Thus, according to the method for fixing a wafer of the present invention, the effective area on the wafer surface which is intended to be processed is not substantially reduced, the temperature of the wafer can easily be controlled and the time and labor required before and after the fixation of the wafer can considerably be saved.

Now, there will be described, with reference to FIGS. 3 to 6 attached hereto, first to fourth embodiments of the wafer-transporting tray mounted on a tray-supporting stage, according to the present invention, while the tray provided with an embedded electrostatic chuck electrode is placed on the tray-supporting stage.

Figure 3:
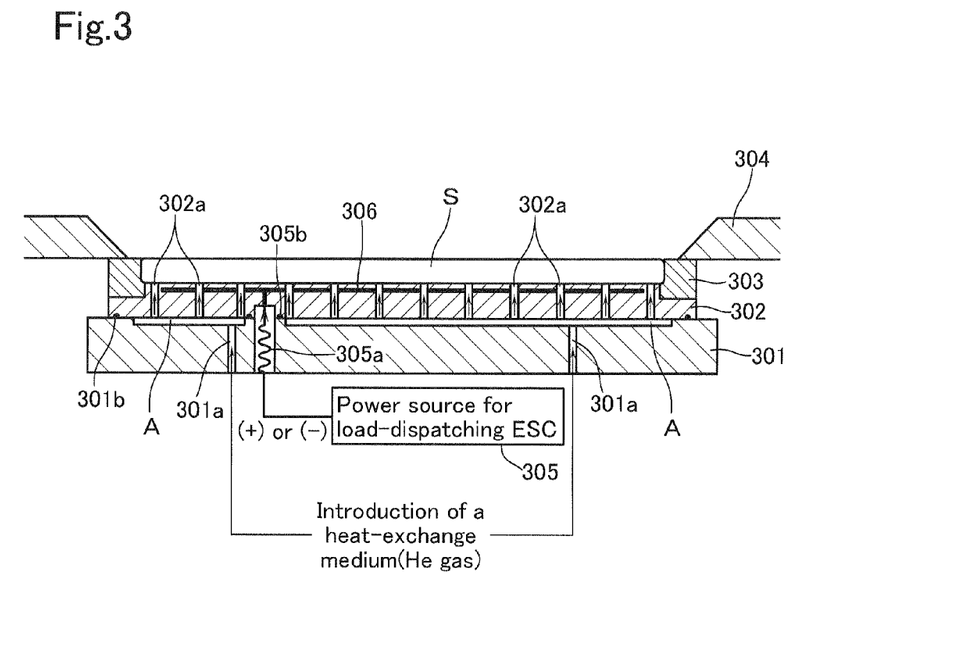
FIG. 3 is a schematic cross sectional view used for explaining and showing a first embodiment of the tray for transporting a wafer according to the present invention, in which the tray for transporting a wafer is shown while it is placed on a tray-supporting stage.

The first embodiment of the wafer-transporting tray, as shown in FIG. 3, relates to a plus or minus mono-polar type load-dispatching system. As will be seen from FIG. 3, the tray-supporting stage 301 is provided with flow paths 301a for allowing a heat-exchange medium (for instance, a cooling gas such as He gas) to flow through the stage and the wafer-transporting tray 302 is also provided with a plurality of flow paths 302a for allowing the heat-exchange medium to flow through the tray. The heat-exchange medium introduced into the flow paths 301a is first supplied to a concave region A (the space formed between the stage and the tray) formed on the side of the surface of the tray-supporting stage 301 and it is then supplied to the back side of the wafer S through the plurality of flow paths 302a which are communicated with the space and accordingly, the heat-exchanging medium can efficiently cool the tray 302 and the wafer S. In FIG. 3, the tray-supporting stage 301 is provided with only two flow paths therein and the wafer-transporting tray 302 is provided with a plurality of flow paths therein, by way of example, but the number of flow paths to be provided therein may appropriately be selected while taking account of, for instance, the size of the wafer to be processed and the intended cooling efficiency.

The wafer S is placed in the concave portion defined, on the surface of the tray 302, by a covering member 303 disposed at the external periphery or edge portion of the tray 302 and the tray 302 is fixed onto the tray-supporting stage 301 through the covering member 303 by the action of a mechanical clamping member 304. In this case, the tray 302 may be fixed, by the electrostatic chucking system, to the tray-supporting stage 301 through the use of an electrostatic chuck (ESC) electrode (not shown in the figure), which is disposed on the surface of the stage 301 or embedded therein, in place of the mechanical clamping member 304.

In the case of the mono-polar load-dispatching system as shown in FIG. 3, the tray 302 is first placed within a plasma-treating chamber (not shown), the wafer S placed on the tray 302 is then electrostatically chucked or fixed to the tray 302 due to the electrostatic force generated by applying an electric power to the electrostatic chuck electrode 306 through a power source 305 for energizing the electrostatic chuck (a power source for energizing ESC) and a spring-type terminal 305a as a load-dispatching terminal. Subsequently, the wafer S is subjected to a plasma-treatment. In this respect, if a heat-exchanging medium such as He gas passes around the load-dispatching portion for energizing the electrostatic chuck electrode 306, a DC discharge may be generated and this may in turn result in the insufficient chucking of the wafer since a high voltage is applied to the load-dispatching portion and therefore, it would be preferred to seal the circumference of the load-dispatching portion (for instance, the periphery of the portion below the tray 302, into which the load-dispatching terminal is introduced) through the use of a sealing member 305b such as an O-ring. Moreover, the tray-supporting stage 301 is preferably liquid-tightly sealed from the tray 302 using a sealing member 301b such as an O-ring so as to prevent any leakage of the heat-exchanging medium through the contact area between the tray-supporting stage 301 and the tray 302.

According to this mono-polar system, the wafer S is placed in the concave region defined, on the surface of the tray 302, by the cover member 303 disposed at the external periphery or edge portion of the tray 302 and therefore, various merits can be enjoyed, such that the wafer S can easily be fixed and that the system is excellent in the stability of the fixation of the wafer. In addition, the wafer S is not pressed at the edge portion thereof, from the above, in this system and accordingly, further merits can likewise be obtained such that the effective area on the wafer surface, which is intended to be processed, is not reduced or that there is not observed any dead area possibly encountered when the wafer is pressed for the fixation thereof. Further, the system is excellent in the efficiency of cooling the wafer.

Figure 4:
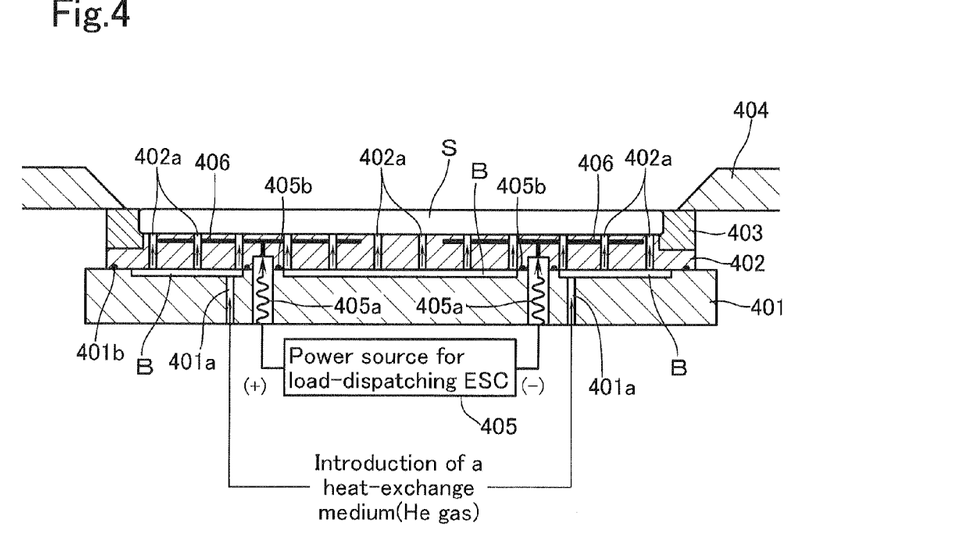
FIG. 4 is a schematic cross sectional view used for explaining and showing a second embodiment of the tray for transporting a wafer according to the present invention, in which the tray for transporting a wafer is shown while it is placed on a tray-supporting stage.

The second embodiment as shown in FIG. 4 relates to the bipolar (plus, minus) load-dispatching or power supply system, unlike the first embodiment. As will be seen from FIG. 4, a tray-supporting stage 401 is equipped with flow paths 401a for the circulation of a heat-exchange medium (for instance, He gas) and a wafer-transporting tray 402 is likewise provided with a plurality of flow paths 402a for the circulation of the heat-exchanging medium. The heat-exchange medium introduced into the flow paths 401a is first supplied to a concave region B (the space formed between the stage and the tray) formed on the side of the surface of the tray-supporting stage 401 and it is then supplied to the back side of the wafer S through the plurality of flow paths 402a which are communicated with the space and accordingly, the heat-exchange medium can efficiently cool the tray 402 and the wafer S. In FIG. 4, the tray-supporting stage 401 is provided with one each of flow path per electrostatic chuck electrode 406 therein and the wafer-transporting tray 402 is provided with a plurality of flow paths therein, by way of example, but the number of flow paths to be provided therein may appropriately be selected while taking account of, for instance, the size of the wafer to be processed and the intended cooling efficiency.

The wafer S is placed in the concave area defined, on the surface of the tray 402, by a cover member 403 disposed at the external periphery or edge portion of the tray 402 and the tray 402 is fixed onto the tray-supporting stage 401 through the covering member 403 by the action of a mechanical clamping member 404. In this case, the tray 402 may be fixed, by the electrostatic chuck system, to the tray-supporting stage 401 through the use of an electrostatic chuck electrode (not shown in the figure), which is disposed on the surface of the stage 401 or embedded therein, in place of the mechanical clamping member.

In the case of the bipolar load-dispatching system as shown in FIG. 4, the tray 402 carrying the wafer S is first placed within a plasma-treating chamber (not shown), the wafer S placed on the tray 402 is then electrostatically chucked or fixed to the tray 402 due to the electrostatic force generated by the application of an electric power to each of the electrostatic chuck electrodes 406 through a power source 405 for energizing the electrostatic chuck and a spring-type terminal 405a as a load-dispatching terminal. Subsequently, the wafer S is subjected to a plasma-treatment. In this respect, if a heat-exchanging medium such as He gas passes around the portion for energizing each electrostatic chuck electrode 406, a DC discharge may be generated and this may in turn result in the insufficient chucking of the wafer since a high voltage is applied to the load-dispatching portion. Therefore, it would be preferred to seal the circumference of the load-dispatching portion (for instance, the periphery of the portion below the tray 402, into which the load-dispatching terminal is introduced) through the use of a sealing member 405b such as an O-ring. Moreover, the tray-supporting stage 401 is preferably liquid-tightly sealed from the tray 402 using a sealing member 401b such as an O-ring so as to prevent any leakage of the heat-exchanging medium through the contact area between the tray-supporting stage 401 and the tray 402.

According to this bipolar system, like the mono-polar system, the wafer S is placed in the concave region defined, on the surface of the tray 402, by the covering member 403 disposed at the external periphery or edge portion of the tray 402 and therefore, various merits can be enjoyed, such that the wafer S can easily be fixed and that the system is excellent in the stability of the fixation of the wafer. In addition, the wafer S is not pressed at the edge portion thereof, from the above, in this system and accordingly, further merits can likewise be obtained such that the effective area on the wafer surface, which is intended to be processed, is not reduced or that there is not observed any dead area possibly encountered when the wafer is pressed for the fixation thereof. Further, the system is excellent in the efficiency of cooling the wafer.

Figure 5:
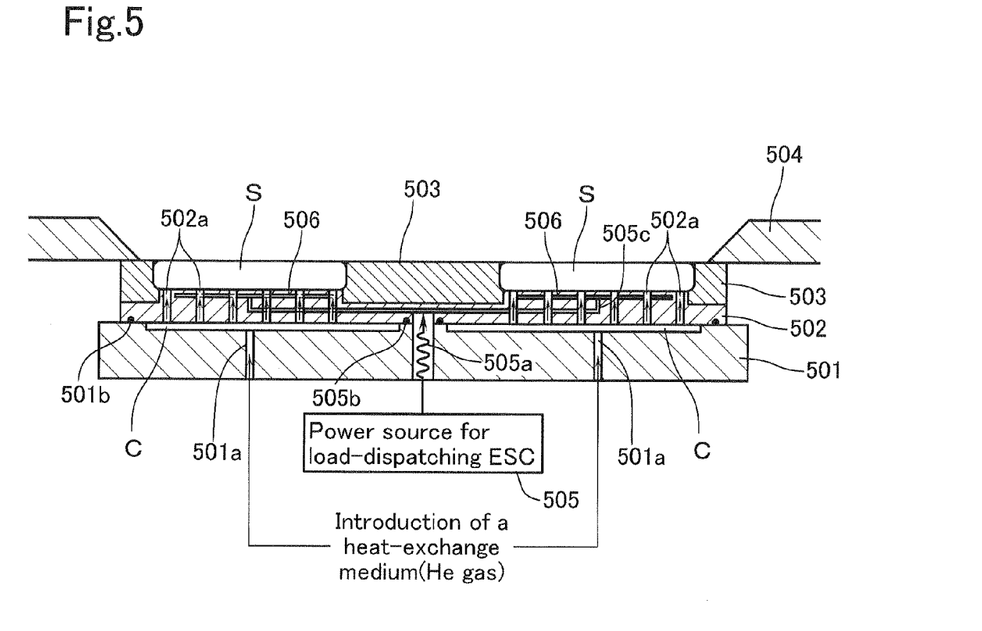
FIG. 5 is a schematic cross sectional view used for explaining and showing a third embodiment of the tray for transporting a wafer according to the present invention, in which the tray for transporting a wafer is shown while it is placed on a tray-supporting stage.

The third embodiment as shown in FIG. 5 relates to a mono-polar type load-dispatching system and corresponds to the case in which a plurality of wafers are collectively processed. As will be seen from FIG. 5, a tray-supporting stage 501 is equipped with flow paths 501a, the number of which is proportional to the number of wafers to be simultaneously processed, for the circulation of a heat-exchange medium (for instance, He gas) and a wafer-transporting tray 502 is likewise provided with a plurality of flow paths 502a for the circulation of the heat-exchange medium. The heat-exchange medium introduced into each of the flow paths 501a is first supplied to a concave region C (the space formed between the stage and the tray) formed on the side of the surface of the tray-supporting stage 501 and it is then supplied to the back side of the wafer S through the plurality of flow paths 502a which are communicated with the space and accordingly, the heat-exchange medium can efficiently cool the tray 502 and each wafer S. In FIG. 5, the tray-supporting stage 501 is provided with one each of flow path per each wafer S, for allowing the heat-exchange medium to flow through the same and the wafer-transporting tray 502 is provided with a plurality of flow paths, by way of example, but the number of flow paths to be provided therein may appropriately be selected while taking account of, for instance, the size of the wafer to be processed and the intended cooling efficiency.

Each wafer S is placed in the concave area defined, on the surface of the tray 502, by a covering member 503 (this will be detailed later in connection with FIG. 7) and the tray 502 is fixed onto the tray-supporting stage 501 through the covering member 503 by the action of a mechanical clamping member 504. In this case, the tray 502 may be fixed, by the electrostatic chuck system, to the tray-supporting stage 501 through the use of an electrostatic chuck electrode, which is disposed on the surface of the stage 501 or embedded therein, in place of the mechanical clamping member.

In the case where a plurality of wafers are collectively processed using the mono-polar load-dispatching system as shown in FIG. 5, the tray 502 carrying the wafers S is first placed within a plasma-treating chamber (not shown), each wafer S placed on the tray 502 is then electrostatically chucked or fixed to the tray 502 due to the electrostatic force generated by the application of an electric power to the electrostatic chuck electrode 506 through a power source 505 for energizing the electrostatic chuck and a spring-type terminal 505a serving as a load-dispatching terminal. Subsequently, each wafer S is subjected to a plasma-treatment. In this respect, if a heat-exchanging medium such as He gas passes around the portion for energizing each electrostatic chuck electrode 506, a DC discharge may be generated and this may in turn result in the insufficient chucking of the wafer since a high voltage is applied to the load-dispatching portion and therefore, it would be preferred to seal the circumference of the load-dispatching portion (for instance, the periphery of the portion below the tray 502, into which the load-dispatching terminal is introduced) through the use of a sealing member 505b such as an O-ring. Moreover, the tray-supporting stage 501 is preferably liquid-tightly sealed from the tray 502 using a sealing member 501b such as an O-ring so as to prevent any leakage of the heat-exchanging medium through the contact area between the tray-supporting stage 501 and the tray 502.

According to this mono-polar system as shown in FIG. 5, like the cases described above, each wafer S is placed in the concave region defined, on the surface of the tray 502, by the covering member 503 disposed at the external periphery or edge portion of the tray 502 and therefore, various merits can be enjoyed, such that the wafer S can easily be fixed, that the system is excellent in the stability of the fixation of the wafer and that a plurality of wafers can collectively be processed. In addition, the wafer S is not pressed at the edge portion thereof, from the above, in this system and accordingly, further merits can likewise be obtained such that the effective area on the surface of each wafer, which is intended to be processed, is not reduced or that there is not observed any dead area possibly encountered when the wafer is pressed for the fixation thereof. Further, the system is excellent in the efficiency of cooling the wafer.

Figure 6:
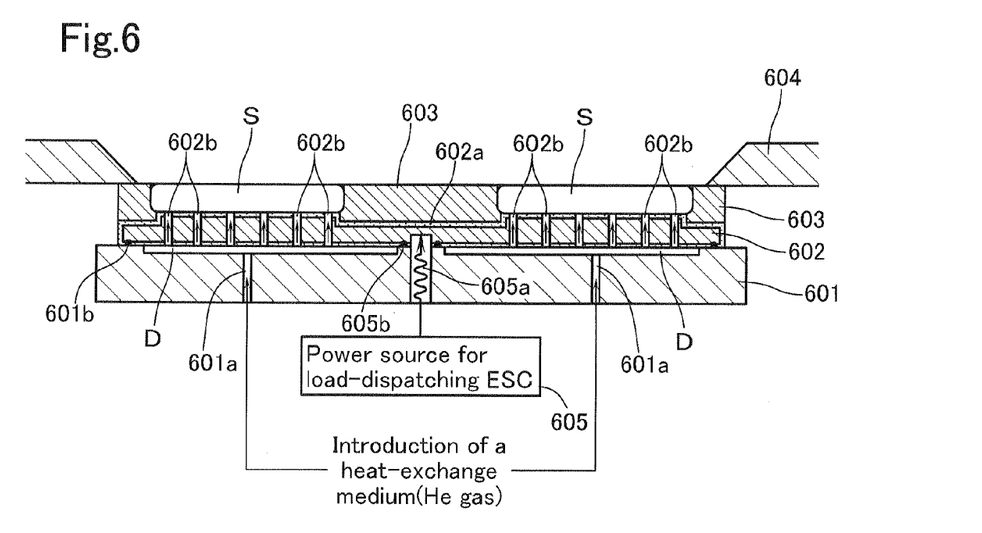
FIG. 6 is a schematic cross sectional view used for explaining and showing a fourth embodiment of the tray for transporting a wafer according to the present invention, in which the tray for transporting a wafer is shown while it is placed on a tray-supporting stage.

The fourth embodiment as shown in FIG. 6 relates to a mono-polar load-dispatching system and corresponds to the case in which a plurality of wafers are collectively processed, but this embodiment employs a tray whose construction is different from that of the tray relating to the third embodiment. More specifically, the tray 602 as shown in FIG. 6 is one comprising a base body constituted by an electrically conductive material such as Al, whose surface is covered with an insulating film 602a consisting of, for instance, $Al_2O_3$ and prepared according to the molten deposition technique or the thermal spraying technique and a spring-type terminal 605a connected to a load-dispatching power source 605 for energizing an electrostatic chuck is so designed that it comes in close contact with the base body constituted by the foregoing electrically conductive material.

In FIG. 6, the reference numerals 601, 601a, 601b, 602b, 603, 604, 605, 605a, and 605b, and the symbols S and D represent a tray-supporting stage, a flow path for circulating a heat-exchange medium, a sealing member, a flow path for circulating a heat-exchange medium, a covering member, a mechanically clamping member, a load-dispatching power source for energizing an electrostatic chuck, a spring-type terminal serving as a load-dispatching terminal, a sealing member, a wafer, and a concave portion formed on the surface of the tray-supporting stage (the space formed between the stage and the tray), respectively and they are the same as those used above in connection with the embodiment as shown in FIG. 5. Accordingly, the detailed description thereof will be omitted herein.

When using the tray which comprises an electrically conductive base body covered with an insulating film as has been discussed above, various merits can be enjoyed, like the other embodiments, such that each wafer S can easily be fixed, that the system is excellent in the stability of the fixation of the wafer and that a plurality of wafers can collectively be processed. In addition, the wafer S is not pressed at the edge portion thereof, from the above, in this system and accordingly, further merits can likewise be obtained, such that the effective area on the surface of each wafer, which is intended to be processed, is not reduced or that there is not observed any dead area possibly encountered when the wafer is pressed for the fixation thereof and further an additional merit can also be enjoyed, such that the production cost can be reduced as compared with the case in which the tray per se is produced from an insulating material. Further, the system is excellent in the efficiency of cooling the wafer.

Then, examples of the wafer-arrangement when a plurality of wafers are collectively processed as shown in FIGS. 5 and 6 and the aforementioned covering member will be described below in detail while referring to FIGS. 7(a-1), 7(a-2), 7(b-1), 7(b-2), 7(c-1), 7(c-2), 7(d-1) and 7(d-2).

Figure 7:
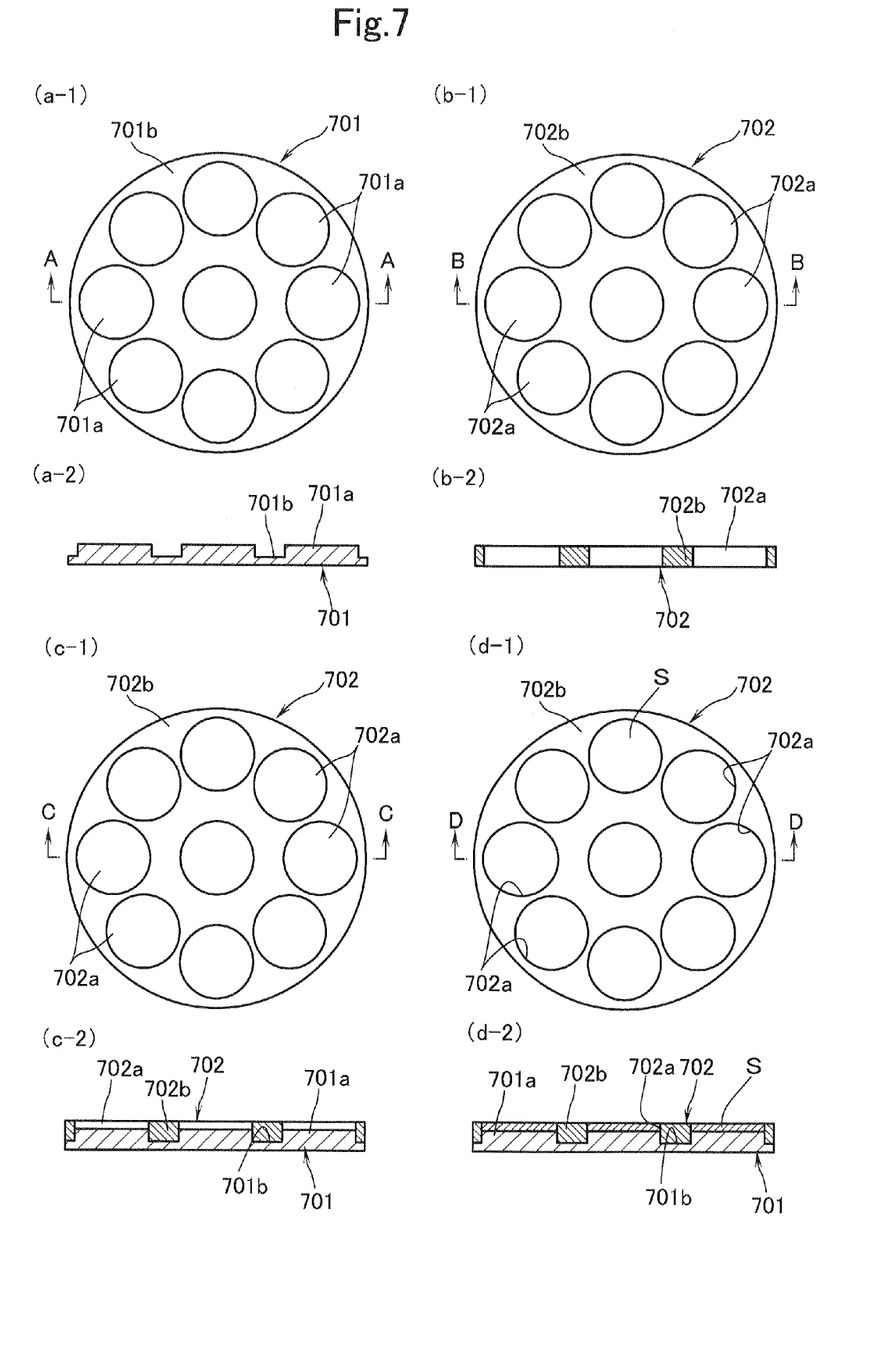
FIG. 7 is a diagram schematically showing an example of the wafer-arrangement and a covering member, when collectively processing a plurality of wafers placed on a tray for transporting wafers according to the present invention and more specifically, FIGS. ($a$-1) to ($d$-1) are plan views thereof and FIGS. ($a$-2) to ($d$-2) are cross sectional views thereof.

As shown in FIG. 7(a-1) as a plan view and FIG. 7(a-2) as a cross sectional view taken along the line A-A of FIG. 7(a-1), a tray substrate 701 is provided with wafer-loading regions 701a in the form of convex regions and concave regions 701b each surrounding the corresponding wafer-loading region 701a. In addition, a tray cover 702 (cover member) shown in FIG. 7(b-1) as a plan view and FIG. 7(b-2) as a cross sectional view taken along the line B-B of FIG. 7(b-1) is put in the concave regions 701b. More specifically, the tray cover 702 comprises spatial regions 702a to be put in the wafer-loading regions 701a and regions 702b to be put in the concave regions 701b. If combining the tray substrate 701 as shown in FIGS. 7(a-1) and 7(a-2) with the tray cover 702 as shown in FIGS. 7(b-1) and 7(b-2), a wafer-transporting tray can be formed, which comprises the tray substrate 701 provided with the wafer-loading regions 701a and the regions 702b serving as regions for separating wafers S from each other, as will be seen from FIG. 7(c-1) as a plan view and FIG. 7(c-2) as a cross sectional view taken along the line C-C of FIG. 7(c-1). This wafer-transporting tray is shown in FIG. 7(d-1) as a plan view and FIG. 7(d-2) as a cross sectional view taken along the line D-D of FIG. 7(d-1), while wafers S are placed on the tray.

The following are the description of the steps and processes of placing wafers on the wafer-transporting tray; conveying the tray provided thereon with the wafers into a plasma-treating chamber; placing the tray on a tray-supporting stage; fixing the tray to the stage by the use of, for instance, a mechanical clamping member or an electrostatic chuck; then fixing the wafers onto the tray by an electrostatic chuck; and subjecting the wafers to a plasma-treatment.

When electrostatically chucking the wafers according to the mono-polar load-dispatching or power supply system, the generation of plasma is first initiated by passing a carrier gas (such as Ar gas) through a plasma-treating chamber at a flow rate ranging from 20 to 100 sccm, and setting the processing pressure and the antenna power (RF) at levels ranging from 5.0 to 10.0 Pa and on the order of about 300 W, respectively. At this stage, the load-dispatching voltage, to be applied through the spring-type terminal, for operating the electrostatic chuck (electrostatically wafer-chucking voltage) supplied from the load-dispatching power source for energizing the electrostatic chuck ranges from 1.5 to 5.0 kV when using an insulating substrate (for instance, the substrate made of sapphire) as a wafer, and 0.5 to 1.5 kV when using the usual substrates other than the insulating substrates and the assembly comprising the tray and the wafers is exposed to the resulting plasma for about 3 seconds and the chucking of the wafers on the tray would thus be completed. Thereafter, these wafers are processed under the process conditions currently used for the processing of wafers (for instance, under the process (film-forming) conditions for the known plasma CVD technique or the process conditions for the plasma etching technique).

Contrary to this, when carrying out the electrostatic chucking according to the bipolar load-dispatching or power supply system, it is not necessary to initiate the generation of plasma and therefore, the chucking of wafers on the tray would be completed by applying a load-dispatching voltage for operating the electrostatic chuck (electrostatically wafer-chucking voltage), which is supplied through the load-dispatching power source for energizing the electrostatic chuck and ranges from 0.5 to 1.5 kV, to the usual wafer other than the substrate made of sapphire. Thereafter, these wafers are processed under the process conditions currently used for the processing of wafers (for instance, under the process (film-forming) conditions for the known plasma CVD technique or the process conditions for the plasma etching technique). In this connection, the substrate made of sapphire cannot electrostatically be chucked according to the bipolar load-dispatching or power supply system.

After the completion of the aforementioned treatment such as the film-forming treatment within a plasma-containing atmosphere or the etching treatment, the tray provided thereon with the wafers thus treated is removed from the plasma-treating chamber, the wafers are then released or de-chucked from the tray according to the usual method to thus detach the wafers from the tray. It would be sufficient for carrying out this de-chucking operation to make, reverse, the polarity of the electrostatic chuck electrode embedded in the tray which is now in an electrically non-conductive state.

As a use example of the wafer-loading tray according to the present invention, there can be listed, for instance, an etching process, in particular, the simultaneous treatment of a plurality of insulating substrates (such as substrates each made of sapphire) in the field of LED production. In other words, it is difficult to electrostatically chuck the insulating substrate (such as a sapphire substrate) according to the usual electrostatic chucking system, but such an insulating substrate can electrostatically be chucked, in high efficiency, according to the mono-polar electrostatic chuck system of the present invention.

For instance, in the process for the production of an LED, an insulating substrate (such as a sapphire substrate) or an epitaxially grown film applied onto the same is subjected to dry etching and, in this case, it is common to collectively treat a plurality of such substrates to improve the production efficiency (to ensure an excellent tact). Accordingly, the use of the wafer-transporting tray of the present invention in this dry etching process would permit the considerable reduction of the running cost and the prevention of any reduction in the yield due to, for instance, operational mistakes. Moreover, the achievement of the same effects discussed above would be expected even in the case of the treatment of wafers on a wafer-transporting tray even in other technical fields.

INDUSTRIAL APPLICABILITY

According to the present invention, a wafer can easily be fixed onto a wafer-transporting tray according to the electrostatic chucking system while making use of an electrostatic chuck electrode which is embedded in the base body of the wafer-transporting tray and accordingly, various merits can be enjoyed, such that the effective area on the surface of a wafer to be processed is not unreasonably reduced, that the temperature of the wafer can easily be controlled and that the time and labor required before and after the fixation of the wafer can considerably be saved. Thus, the present invention can effectively be used in the semiconductor device-manufacturing field in which wafers are subjected to a variety of plasma-treatments.

BRIEF DESCRIPTION OF SYMBOLS

101 . . . Tray-supporting stage; 101$a$ . . . Flow path for heat-exchange medium; 102 . . . Tray; 102$a$ . . . Flow path for heat-exchange medium; 103 . . . Holding jig; 104 . . . Mechanical clamping member; 201 . . . Tray-supporting stage; 201$a$ . . . Flow path for heat-exchange medium; 202 . . . Tray; 203 . . . Mechanical clamping member; 204 . . . Thermally conductive adhesive sheet; 301, 401, 501, 601 . . . Tray-supporting stage; 301$a$, 401$a$, 501$a$, 601$a$ . . . Flow path for heat-exchange medium; 301$b$, 401$b$, 501$b$, 601$b$ . . . Sealing member; 302, 402, 502, 602 . . . Wafer-transporting tray; 302$a$, 402$a$, 502$a$, 602$b$ . . . Flow path for heat-exchange medium; 303, 403, 503, 603 . . . Covering member; 304, 404, 504, 604 . . . Mechanical clamping member; 305, 405, 505, 605 . . . Power supplying source for energizing electrostatic chuck; 305$a$, 405$a$, 505$a$, 605$a$ . . . Spring-type terminal; 305$b$, 405$b$, 505$b$, 605$b$ . . . Sealing member; 306, 406, 506 . . . Electrostatic chuck electrode; 602$a$ . . . Insulating film; 701 . . . Base body for tray; 701$a$ . . . wafer-loading region; 702 . . . Tray cover (covering member); 702$a$ . . . spatial region; 702$b$ . . . Region; S . . . Wafer; A to D . . . Space.

The invention claimed is:

1. A method for fixing a wafer characterized in that it comprises the steps of placing a wafer on a tray for transporting the same, which comprises a base body consisting of an insulating material and an electrostatic chuck electrode embedded in the base body, wherein a terminal at a load-dispatching or power supply portion for energizing the electrostatic chuck electrode is a spring-type terminal, the spring-type terminal is so designed that the tip of the same can come in touch with the electrostatic chuck electrode to thus allow the tray to fix the wafer by an electrostatic chucking system upon passing an electric current through the same, and further the tray is so designed that a sealing member is provided at the periphery of the load-dispatching portion so that any heat-exchange medium never passes around a contact portion or area between the tip of the spring-type terminal and the electrostatic chuck electrode; conveying the tray provided thereon with a wafer to a plasma-processing chamber to thus mount the tray on a tray-supporting stage; fixing the tray onto the tray-supporting stage by a mechanical chuck or an electrostatic chuck; and then supplying an electric power to the spring-type terminal to thus fix the wafer to the tray by an electrostatic chucking system.

2. A method for fixing a wafer characterized in that it comprises the steps of placing a wafer on a tray for transporting the same, which is composed of a base body made of an electrically conductive material, whose surface is covered with an insulating material and an electrostatic chuck electrode embedded in the base body, wherein a terminal at a load-dispatching portion for energizing the electrostatic chuck electrode is a spring-type terminal, the spring-type terminal is so designed that the tip of the same can come in touch with the electrostatic chuck electrode to thus allow the tray to fix the wafer by an electrostatic chucking system upon passing an electric current through the same, and further the tray is so designed that a sealing member is provided at the periphery of the load-dispatching portion so that any heat-exchanging medium never passes around a contact portion or area between the tip of the spring-type terminal and the electrostatic chuck electrode; conveying the tray provided thereon with a wafer to a plasma-processing chamber to thus mount the tray on a tray-supporting stage; fixing the tray onto the tray-supporting stage by a mechanical chuck or an electrostatic chuck; and then supplying an electric power to the spring-type terminal to thus fix the wafer to the tray by an electrostatic chucking system.

3. The method for fixing a wafer as set forth in claim 1, wherein a mono-polar electrostatic chuck or a bipolar electrostatic chuck is used as the electrostatic chuck.

4. The method for fixing a wafer as set forth in claim 1, wherein the wafer used is an insulating substrate, the electrostatic chuck used is a mono-polar electrostatic chuck and the generation of plasma is initiated within the plasma-treating chamber upon the supply of an electric current to the spring-type terminal to thus fix the wafer to the tray by the electrostatic chucking system.

5. The method for fixing a wafer as set forth in claim 2, wherein a mono-polar electrostatic chuck or a bipolar electrostatic chuck is used as the electrostatic chuck.

6. The method for fixing a wafer as set forth in claim 2, wherein the wafer used is an insulating substrate, the electrostatic chuck used is a mono-polar electrostatic chuck and the generation of plasma is initiated within the plasma-treating chamber upon the supply of an electric current to the spring-type terminal to thus fix the wafer to the tray by the electrostatic chucking system.

7. A tray for transporting a wafer which comprises a base body consisting of an insulating material and an electrostatic chuck electrode embedded in the base body, wherein a terminal at a load-dispatching or power supply portion for energizing the electrostatic chuck electrode is a spring-type terminal, the spring-type terminal is so designed that the tip of the same contacts the electrostatic chuck electrode to fix the wafer to the tray by an electrostatic chucking system upon passing an electric current through the same, and further the tray is so designed that a sealing member is provided at the periphery of the load-dispatching portion so that any heat-exchanging medium never passes around a contact portion or area between the tip of the spring-type terminal and the electrostatic chuck electrode, and wherein the tray is further provided with a plurality of flow paths for allowing a heat-exchange medium to pass through the same, which are formed through the tray and thus communicate the back face with the surface thereof, and each of the flow paths is so designed that it can supply, to the back face of the wafer, the heat-exchange medium which is introduced into a space formed between the back face of the tray and the surface of a wafer-supporting stage, when the tray is placed on the stage, and wherein the wafer fixed to the tray by the electrostatic chucking system upon passing the electric current through the same is placed in a concave region defined on the surface of the tray by a tray cover disposed at the tray.

8. A tray for transporting a wafer which is composed of an electrically conductive material and an insulating material covering the surface of the former, wherein a terminal at a load-dispatching portion for energizing the electrically conductive material serving as an electrostatic chuck electrode is a spring-type terminal, the spring-type terminal is so designed that the tip of the same contacts the electrically conductive material to fix the wafer to the tray by an electrostatic chucking system upon passing an electric current through the same, and further the tray is so designed that a sealing member is provided at the periphery of the load-dispatching portion so that any heat-exchanging medium never passes around a contact portion or area between the tip of the spring-type terminal and the electrostatic chuck electrode and wherein the tray is further provided with a plurality of flow paths for allowing a heat-exchange medium to pass through the same, which are formed through the tray and thus communicate the back face with the surface thereof, and each of the flow paths is so designed that it can supply, to the back face of the wafer, the heat-exchange medium which is introduced into a space formed between the back face of the tray and the surface of a wafer-supporting stage, when the tray is placed on the stage, and wherein the wafer fixed to the tray by the electrostatic chucking system upon passing the electric current through the same is placed in a concave region defined on the surface of the tray by a tray cover disposed at the tray.

9. A tray for transporting a wafer which comprises a base body consisting of an insulating material and an electrostatic chuck electrode embedded in the base body, wherein a terminal at a load-dispatching or power supply portion for energizing the electrostatic chuck electrode is a spring-type terminal, the spring-type terminal is so designed that the tip of the same contacts the electrostatic chuck electrode to fix the wafer to the tray by an electrostatic chucking system upon passing an electric current through the same, and further the tray is so designed that a sealing member is provided at the periphery of the load-dispatching portion so that any heat-exchanging medium never passes around a contact portion or area between the tip of the spring-type terminal and the electrostatic chuck electrode, and wherein the wafer fixed to the tray by the electrostatic chucking system upon passing the electric current through the same is placed in a concave region defined on the surface of the tray by a tray cover disposed at the tray.

10. A tray for transporting a wafer which is composed of an electrically conductive material and an insulating material covering the surface of the former, wherein a terminal at a load-dispatching portion for energizing the electrically conductive material serving as an electrostatic chuck electrode is a spring-type terminal, the spring-type terminal is so designed that the tip of the same contacts the electrically conductive material to fix the wafer to the tray by an electrostatic chucking system upon passing an electric current through the same, and further the tray is so designed that a sealing member is provided at the periphery of the load-dispatching portion so that any heat-exchanging medium never passes around a contact portion or area between the tip of the spring-type terminal and the electrostatic chuck electrode, and wherein the wafer fixed to the tray by the electrostatic chucking system upon passing the electric current through the same is placed in a concave region defined on the surface of the tray by a tray cover disposed at the tray.

\* \* \* \* \*